(12) United States Patent
Tu et al.

(10) Patent No.: US 7,897,055 B2
(45) Date of Patent: *Mar. 1, 2011

(54) METHOD FOR MANUFACTURING MULTILAYER FLEXIBLE PRINTED CIRCUIT BOARD

(75) Inventors: Chih-Yi Tu, Taoyuan (TW);
Cheng-Hsien Lin, Taoyuan (TW);
I-Hsien Chiang, Taoyuan (TW)

(73) Assignee: Foxconn Advanced Technology Inc., Tayuan, Taoyuan (TW)

( * ) Notice: Subject to any disclaimer, the term of this patent is extended or adjusted under 35 U.S.C. 154(b) by 694 days.

This patent is subject to a terminal disclaimer.

(21) Appl. No.: 11/865,619

(22) Filed: Oct. 1, 2007

(65) Prior Publication Data
US 2008/0116166 A1 May 22, 2008

(30) Foreign Application Priority Data
Nov. 17, 2006 (CN) .......................... 2006 1 0156915

(51) Int. Cl.
*H01B 13/00* (2006.01)
*B44C 1/22* (2006.01)
*C23F 1/00* (2006.01)

(52) U.S. Cl. ............... 216/13; 216/17; 216/65; 29/831; 29/846; 29/852; 219/121.19

(58) Field of Classification Search ............ 213/13, 213/17, 65; 219/121.19; 29/831, 846, 852
See application file for complete search history.

(56) References Cited

U.S. PATENT DOCUMENTS

| 5,421,083 | A * | 6/1995 | Suppelsa et al. | 29/852 |
| 7,581,312 | B2 * | 9/2009 | Tu et al. | 29/831 |
| 2002/0023778 | A1 * | 2/2002 | Watanabe | 174/262 |
| 2005/0037281 | A1 * | 2/2005 | Sato et al. | 430/270.1 |
| 2008/0250637 | A1 * | 10/2008 | Zhang et al. | 29/852 |

* cited by examiner

*Primary Examiner* — Shamim Ahmed
(74) *Attorney, Agent, or Firm* — Jeffrey T. Knapp

(57) ABSTRACT

The present inventions relates to a method for manufacturing a multilayer FPCB having different number of layers in different areas. The method includes the steps of: providing a binder layer; removing a portion of the binder layer thereby defining an opening in the binder layer; forming a multilayer FPCB which having a first copper clad laminate structure and a second copper clad laminate structure disposed on two opposite sides of the binder layer respectively using the binder layer; cutting the first copper clad laminate structure; cutting the multilayer FPCB in manner that a portion of first copper clad laminate structure that is exposed to the opening is separated from the first copper clad structure thereby obtain a multilayer FPCB having different number of layers in different areas.

20 Claims, 25 Drawing Sheets

METHOD FOR MANUFACTURING MULTILAYER FLEXIBLE PRINTED CIRCUIT BOARD

BACKGROUND

1. Technical Field

The present invention relates to a method for manufacturing a flexible printed circuit board, and especially to a method for manufacturing a multilayer flexible printed circuit board having different numbers of layers in different areas.

2. Discussion of Related Art

Flexible printed circuit boards (FPCB) have been widely used in electronic products such as mobile phones, printing heads and hard disks. In these electronic products, some movable parts are advantageously connected to a main body via a flexible printed circuit board. FPCB can assure power supply and signal transmission in such environment due to their excellent flexibility.

FIG. 5F shows a multilayer FPCB structure, which has different number of layers in different areas; in other words, there are a thick area with a number of layers and a thin area with less layers in a same FPCB. The thick area can have a higher circuit density whilst the thin area exhibits higher flexibility.

FIGS. 5A to 5F show a conventional process for manufacturing such type of FPCB. As is shown in FIGS. 5A and 5B, a first copper clad laminate (CCL) 41, a binder layer 45, a second CCL 42 are laminated sequentially. As is shown FIG. 5C, dry films 412, 422 are applied on the first CCL 41 and the second CCL 42 respectively, and then the dry films 412, 422 are exposed and developed. Because there is a cliff-like thickness difference between the first CCL 41 and the second CCL 42, a gap 46 is formed at the "cliff".

As is shown in FIG. 5D, the first CCL 41 and the second CCL 42 are etched using an etchant and the dry films 412, 422 are removed, the etching step, the etchant can seep into the gap 46 and react with dielectric layers in the first CCL 41 and the second CCL 42. As a result the dielectric layers may peel off from the CCL.

Referring to FIG. 5E, a third CCL 43 and a fourth CCL 44 are laminated with the first CCL 41 and the second CCL 42 respectively. Referring to FIG. 5F, a through hole 47 is formed. The through hole 47 can be made by drilling or by laser ablation. After the through hole 47 is formed, a conductive layer is formed on a surface of the through hole 47 by electroless plating or electroplating. In the plating process the dielectric layer of the second CCL 42 is exposed to a plating solution thereby forming a number of copper lumps thereon. These copper lumps can pierce dry film that applied on the second CCL 42 in the next pattern-forming process, and etchant used for developing the dry film can react with dielectric layer or copper layer of second CCL 42 and cause poor quality product to be formed.

In the aforementioned process for manufacturing multilayer FPCB that has different number of layers in different areas, a fall structure between different CCLs can causes a series of quality problems, therefore there is a desire to develop a process that can solve aforementioned quality problems.

SUMMARY OF THEN INVENTION

This and other features and advantages of the present invention as well as the preferred embodiments thereof and a method for manufacturing a multilayer flexible printed circuit board having different number of layers in different areas in accordance with the invention will become apparent from the following detailed description and the descriptions of the drawings.

In one embodiment, a method for manufacturing a multilayer FPCB includes the following steps. Firstly, a binder layer is provided and a portion of the binder layer is removed thereby defining an opening in the binder layer. Secondly, a first copper clad laminate structure and a second copper clad laminate structure are attached on opposite sides of the binder layer, thus a multilayer FPCB is formed. Each of the first copper clad laminate structure and the second copper clad laminate structure includes at least one dielectric layer and at least one conductive layer formed thereon. The first copper clad laminate structure should have an excess portion, the excess portion being located above the opening of the binder layer. Thirdly, a first slit is made in the first copper clad laminate structure along a boundary of the excess portion. The first slit is in communication with the opening of the binder layer. Finally, the excess portion of the first copper clad laminate is removed along the boundary of the excess portion of the first copper clad laminate, thus a portion of the second copper clad laminate is exposed to an exterior through the opening of the binder layer.

BRIEF DESCRIPTION OF THE DRAWINGS

Many aspects of the present invention can be better understood with reference to the following drawings. The components in the drawings are not necessarily drawn to scale, the emphasis instead being placed upon clearly illustrating the principles of the present invention.

DETAILED DESCRIPTION OF THE PREFERRED EMBODIMENTS

Figure 1:
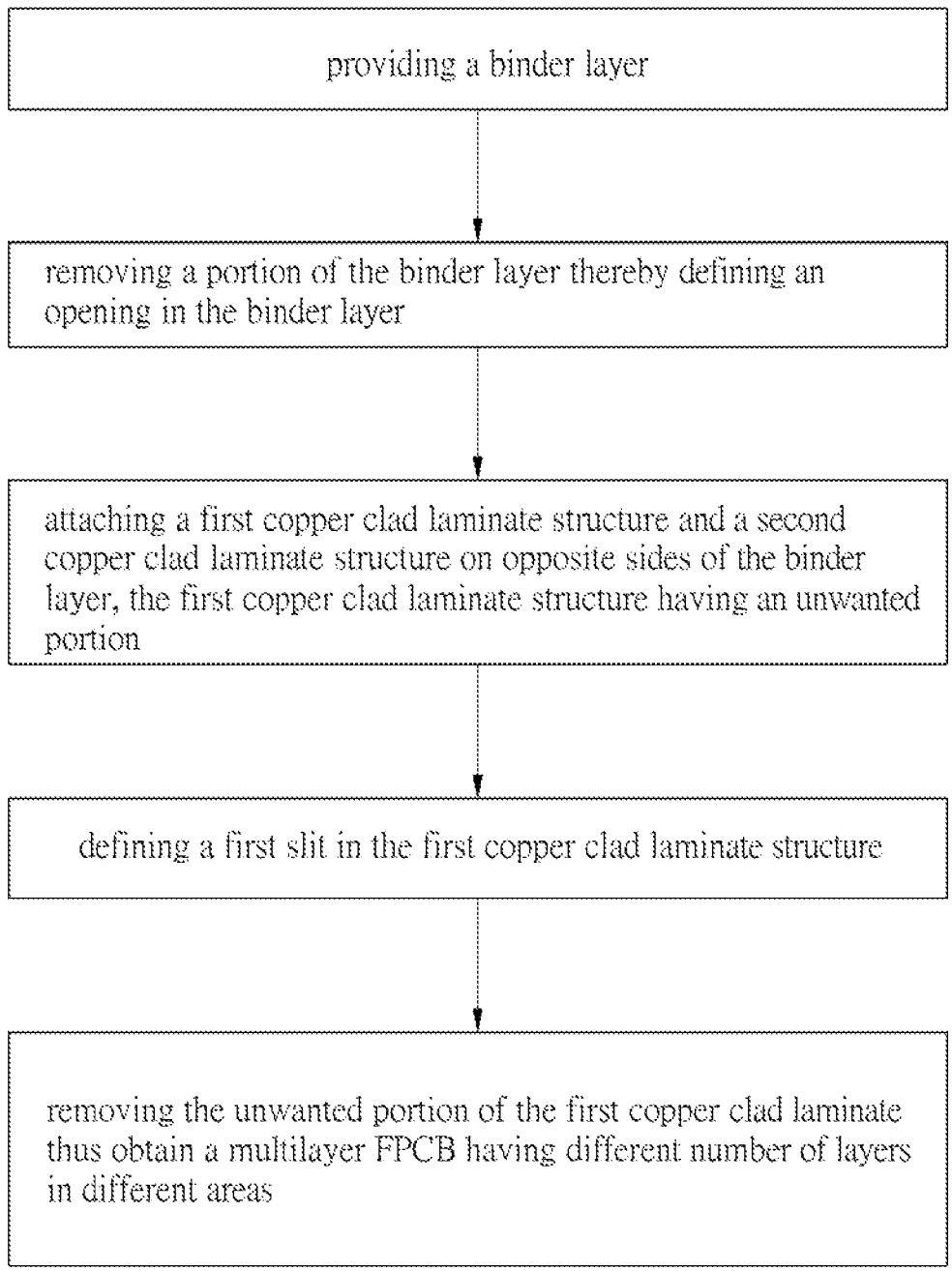
FIG. 1 is a flow chart showing a process for manufacturing a multilayer FPCB having a different number of layers in different areas.

Referring to FIG. 1, a method for manufacturing a multilayer FPCB having a different number of layers in different areas includes the steps in no particular order of providing a binder layer; removing a portion of the binder layer thereby defining an opening in the binder layer; attaching a first copper clad laminate structure and a second copper clad laminate structure on opposite sides of the binder layer, the first copper clad laminate structure having an excess portion; defining a first slit in the first copper clad laminate structure; and removing the excess portion of the first copper clad laminate structure, thus obtaining a multilayer FPCB having a different number of layers in different areas.

The method will be described in detail with the following preferred embodiments:

FIGS. 2A to 2L show a process for manufacturing a FPCB that has different numbers of layers in different areas in accordance with a first preferred embodiment.

Figure 2A:
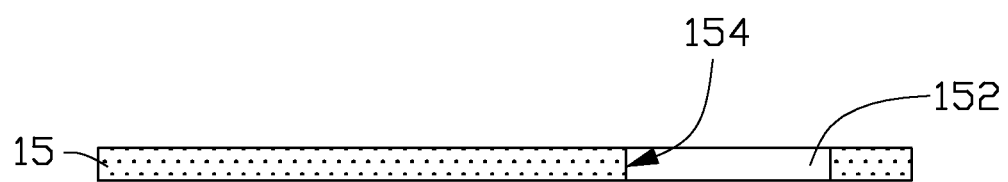
FIGS. 2A to 2L are schematic views showing a process for manufacturing a multi layer FPCB having a different number of layers in different areas in accordance with a first, preferred embodiment.

Referring to FIG. 2A, a binder layer 15 is provided and a portion of the binder layer 15 is removed thereby forming an opening 152 in the binder layer 15. The opening 152 can be formed by cutting, stamping, laser ablation or etching. The binder layer 15 has a side-wall 154 exposed in the opening 152. In this preferred embodiment, the opening 152 has a rectangular shape. Alternatively, the opening 152 can be other shapes, for example, trapezium, triangle etc.

Figure 2B:
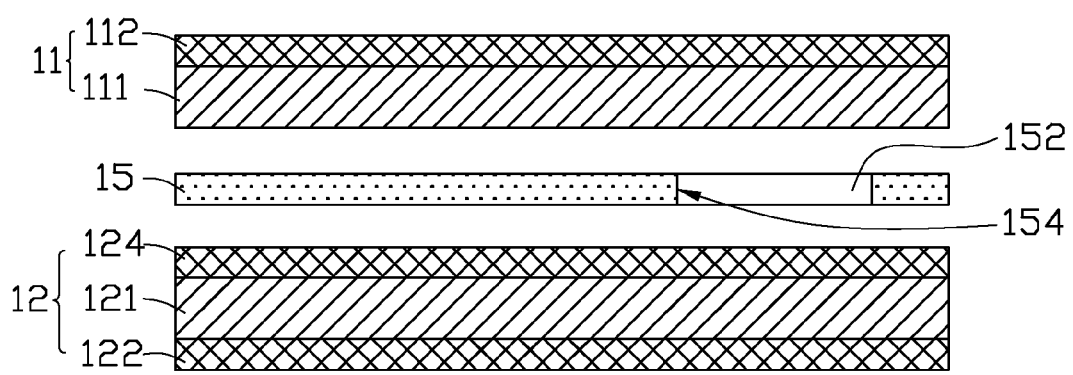

Referring to FIG. 2B, a first copper clad laminate 11 and a second copper clad laminate 12 are provided. The first copper clad laminate 11 includes a dielectric layer 111 and a conductive layer 112 formed on the dielectric layer 111. The second copper clad laminate 12 includes a dielectric layer 121 and two conductive layers 122 and 124 formed on two opposite sides of the dielectric layer 121 respectively. The dielectric layers 111, 121 and the binder layer 15 can be made of one material selected from the group consisting of polyimide, polytetrafluroethylene, polythiamine, polycarbonate, polycarbonate ester, polyester, and copolymer of imide, ethylene and dimethyl terephthalate. The conductive layers 112, 122, 124 can be made of a conductive material, such as copper, silver or aluminum.

Figure 2C:
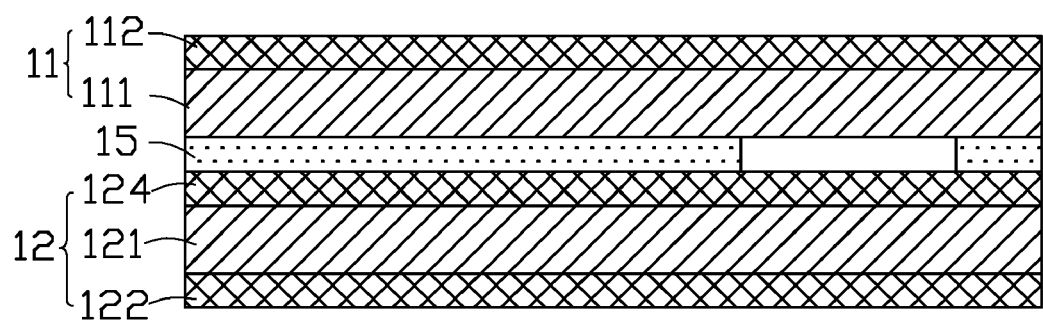

Referring to FIG. 2C, the first copper clad laminate 11, the binder layer 15 and the second copper clad laminate 12 are laminated. In detail, the binder layer 15 is laminated so as to be sandwiched between the dielectric layer 111 of the first copper clad laminate 11 and the conductive layer 124 of the second copper clad laminate 12. A portion of the conductive layer 124 is exposed in the opening 152. The conductive layer 112 of the first copper clad laminate 11 and the conductive layer 122 of the second copper clad laminate 12 are exposed to the exterior. Advantageously, a laminating machine is used in this step.

Figure 2D:
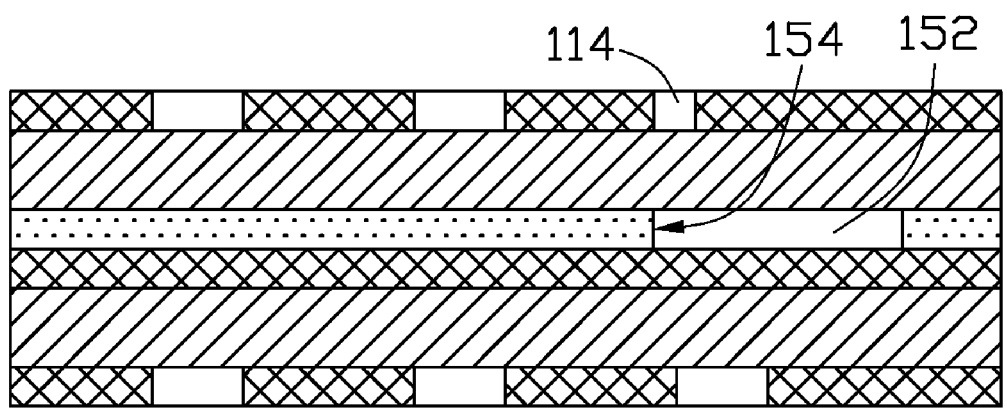

Referring to FIG. 2D, conductive patterns are formed in the first copper clad laminate 11 and the second copper clad laminate. That is, the conductive layer 112 of the first copper clad laminate 11 and the conductive layer 122 of the second copper clad laminate 12 both have conductive patterns formed therein. In this step, a sub-slit 114 is formed at a predetermined position in the conductive layer 112 of the first copper clad laminate 11. Specifically, the sub-slit 114 is corresponding to and aligned with the side-wall 154 of the opening 152.

Figure 2E:
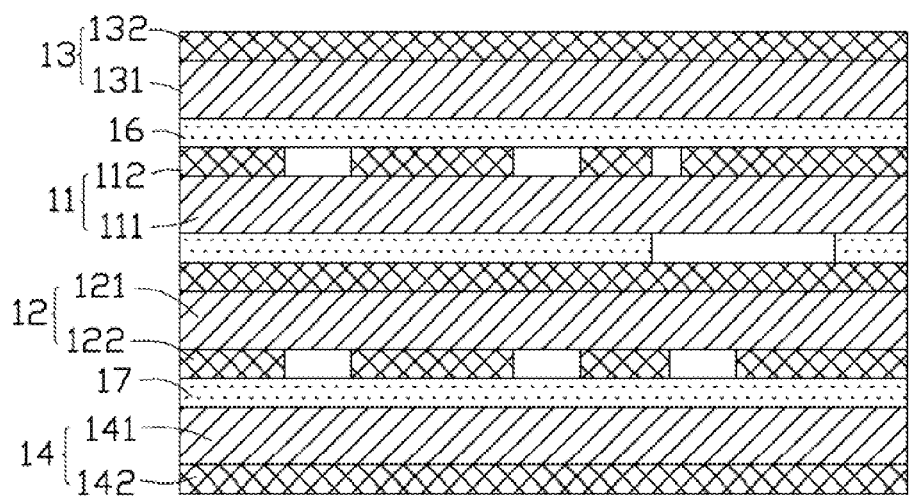

Referring to FIG. 2E, a third copper clad laminate 13 and a fourth copper clad laminate 14 are laminated on the first copper clad laminate 11 and the second copper clad laminate 12, respectively. The third copper clad laminate 13 includes a dielectric, layer 131 and a conductive layer 132 formed on the dielectric layer 131. The fourth copper clad laminate 14 has similar structure to the third copper clad laminate 13. The fourth copper clad laminate 14 includes a dielectric layer 141 and a conductive layer 142 formed on the dielectric layer 141. The third copper clad laminate 13 and the first copper clad laminate 11 are bound via a binder layer 16. In detail, the binder layer 16 is sandwiched between the dielectric layer 131 of the third copper clad laminate 13 and the conductive layer 112 of the first copper clad laminate 11. The second copper clad laminate 12 and the fourth copper clad laminate 14 are bound via a binder layer 17. In particular, the binder layer 17 is sandwiched between the dielectric layer 141 of the fourth copper clad laminate 14 and the conductive layer 122 of the second copper clad laminate 12. That is, the conductive layer 132 of the third copper clad laminate 13 and the conductive layer 142 of the third copper clad laminate 14 are exposed to the exterior.

Figure 2F:
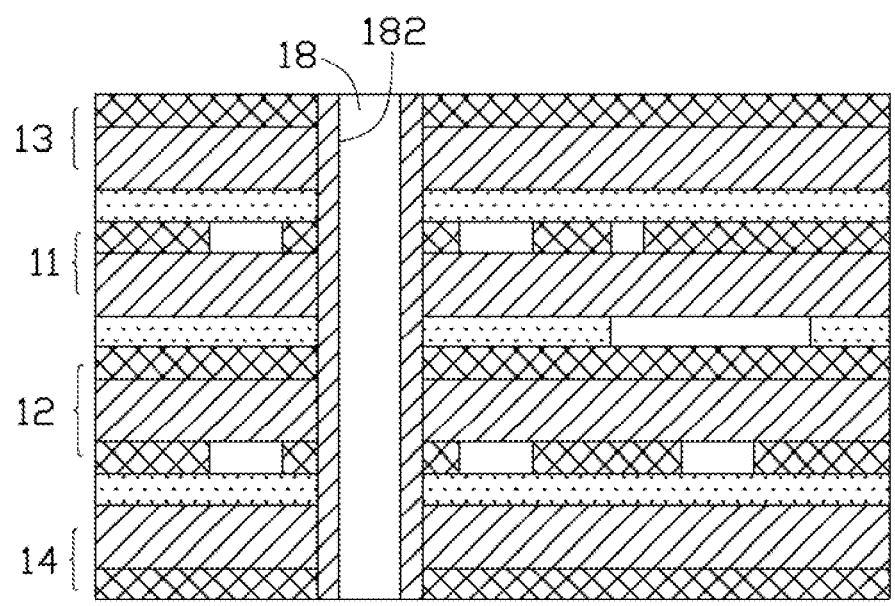

Referring to FIG. 2F, a through hole 18 penetrating through the first, second, third and fourth copper clad laminates 11, 12, 13 and 14 is formed and a conductive layer 182 is coated on an inner side-wall of the through hole 18 for providing conduction between the conducive layers 112, 122, 124, 132, and 142 in the first, second, third and fourth copper clad laminates 11, 12, 13 and 14.

Figure 2G:
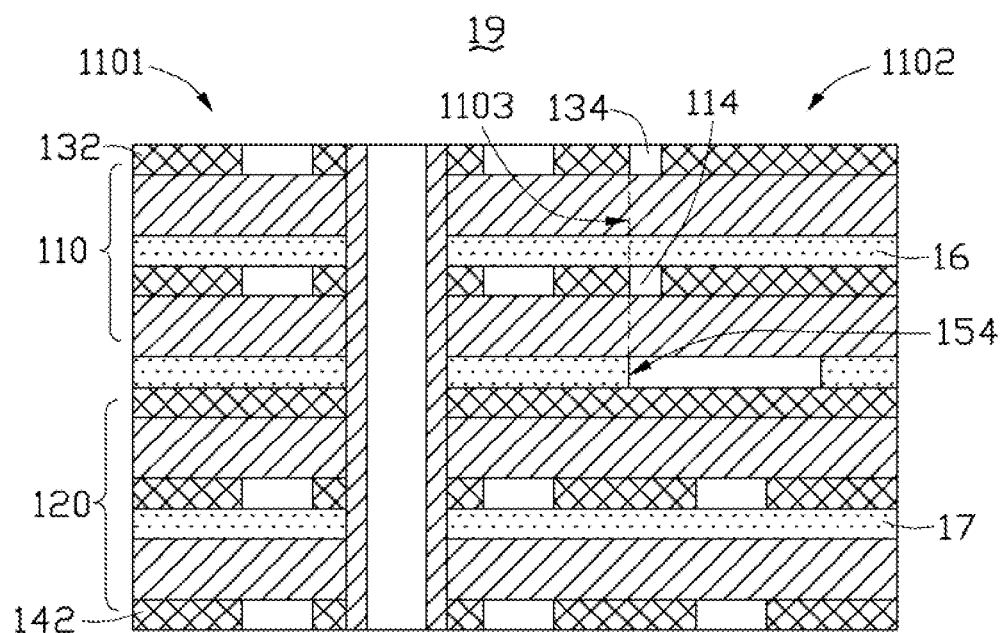

Referring to FIG. 2G, conductive patterns are formed in the conductive layer 132 of the third copper clad laminate 13 and in the conductive layer 142 of the fourth copper clad laminate 14. In this step, a sub-slit 134 is formed at a predetermined position in the conductive layer 132 of the third copper clad laminate 13. Specifically, the sub-slit 134 is corresponding to and aligned with the side-wall 154 of the opening 152. In other words, the sub-slits 114, 134 are aligned with each other. After this step, a four layer flexible printed circuit board substrate 19 is formed.

The first copper clad laminate 11, the binder layer 16, and the third copper clad laminate 13 constitute a first copper clad laminate structure 110. The second copper clad laminate 12, the binder layer 17, and the fourth copper clad laminate 14 constitute a second copper clad laminate structure 120. The conductive layers 132, 142 are at the outmost side of the FPCB substrate 19. The first copper clad laminate structure 110 includes a first end 1101 and a second end 1102. An interface 1103 between the first end 1101 and the second end 1102 is corresponding to and aligned with the side-wall 154. The sub-slits 114, 134 are all formed close to the interface 1103. Specifically, a portion of the interface 1103 is exposed in the sub-slits 114, 134.

Figure 2H:
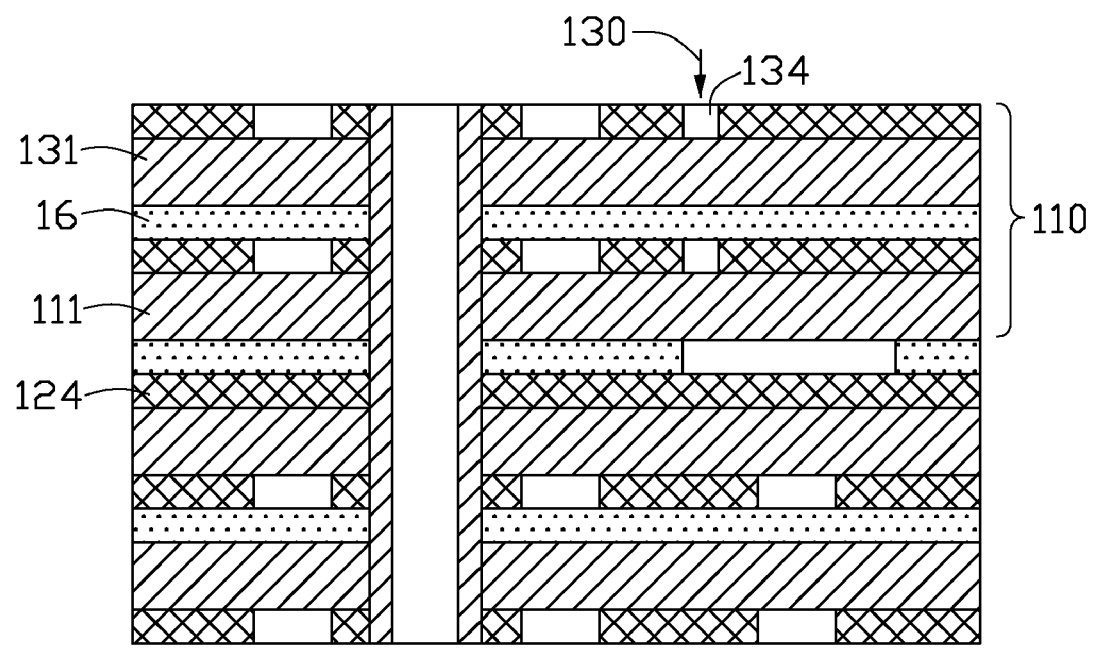
Figure 2I:
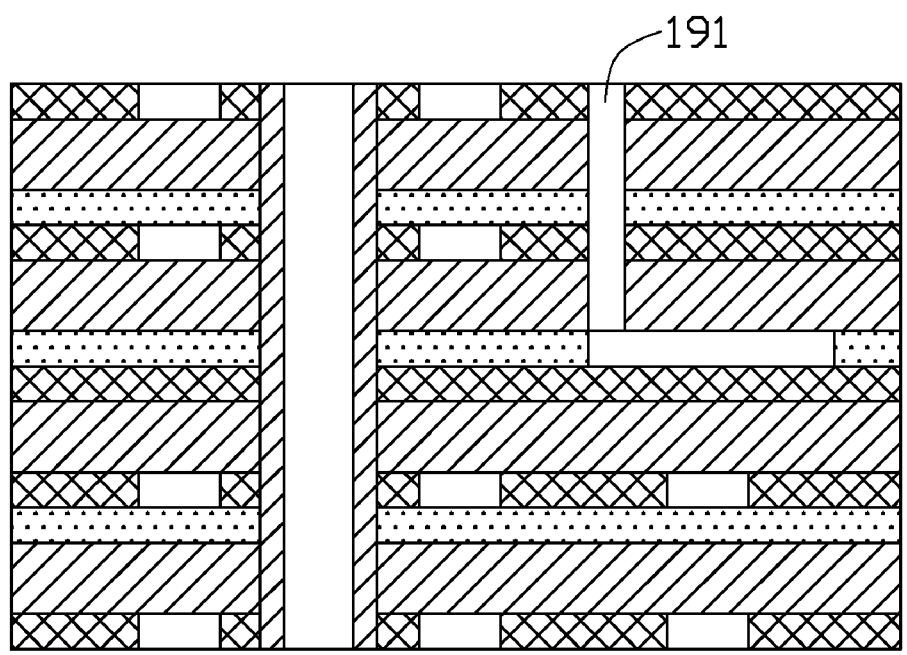
Figure 2J:
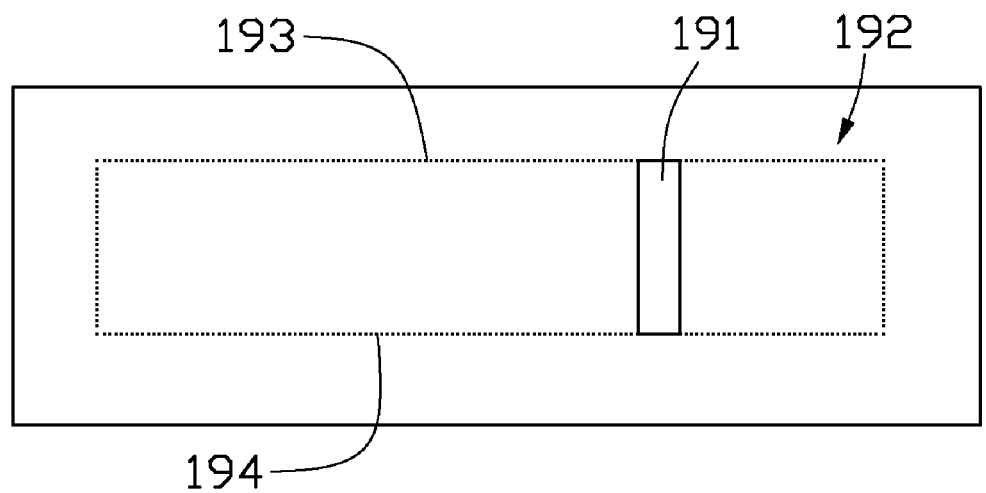

Referring to FIG. 2H, a laser beam 130 is applied to the first copper clad laminate structure 110 and aligned with the sub-slits 114, 134 to cut the dielectric layer 131 of the third copper clad laminate 13, the binder layer 16, and the dielectric layer 111 of the first copper clad laminate 11. The laser beam 130 can be produced by a carbon dioxide laser. When the laser beam 130 reaches the conductive layer 124, the conductive layer 124 prevents the laser beam 130 from cutting deeper. In other words, the conductive layer 124 acts as a protective metallic block, which prevents the laser beam 130 from cutting any deeper. Referring to FIGS. 2I and 2J, a slit 191 penetrating through the first copper clad laminate structure 110 is formed after the laser beam-cutting step. An area 192 defines a shape of a FPCB. In the illustrated embodiment, the area 192 is rectangular, and has a first side 193 and a second side 194 opposite to the first side 193. The slit 191 extends from the first side 193 to the second side 194. The interface 1103 is exposed to the slit 191.

Figure 2K:
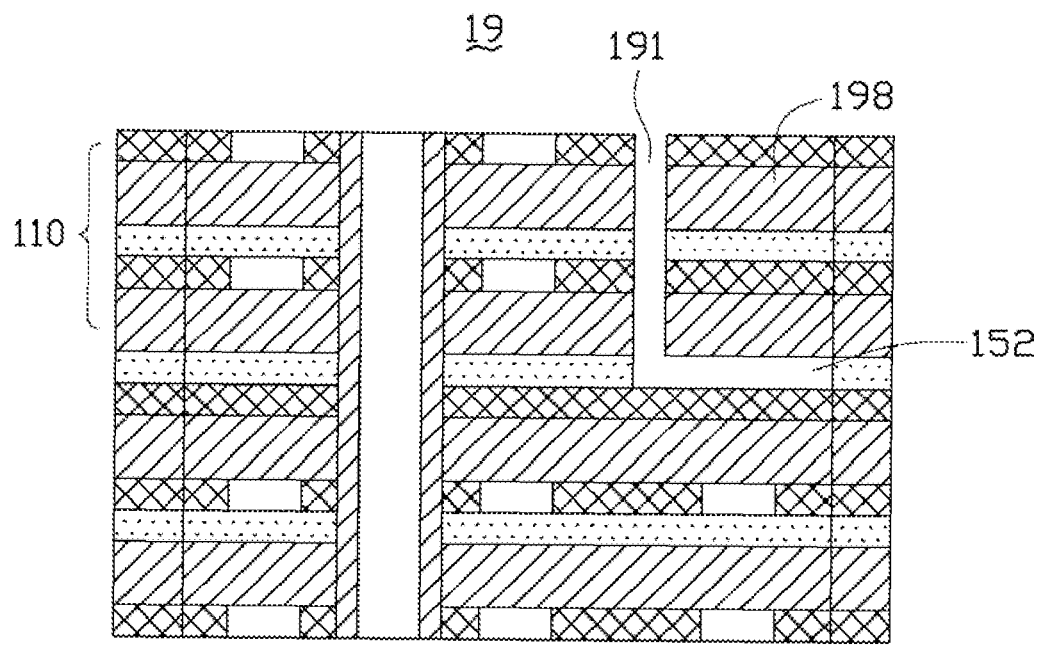

Referring to FIG. 2K, the flexible printed circuit board substrate 19 is cut along the boundary of the area 192 into a shape. Stamping is a preferred process for this step. A portion or the boundary of the area 192 coincides with that of the opening 152. The flexible printed circuit board substrate 19 is cut so that a portion 198 of the first copper clad laminate structure 110, which is exposed to the opening 152 and the slit 191, is separated from the first copper clad laminate structure 110. That is, the portion 198 of the first copper clad laminate structure 110 is defined by the opening 152, the slit 191 and a portion of the cutting route of this step. In other words, the slit 191 is defined along a portion of the boundary of the portion 198, and the portion of the cutting route of this step coincides with the other portion of the boundary of the portion 198.

Figure 2L:
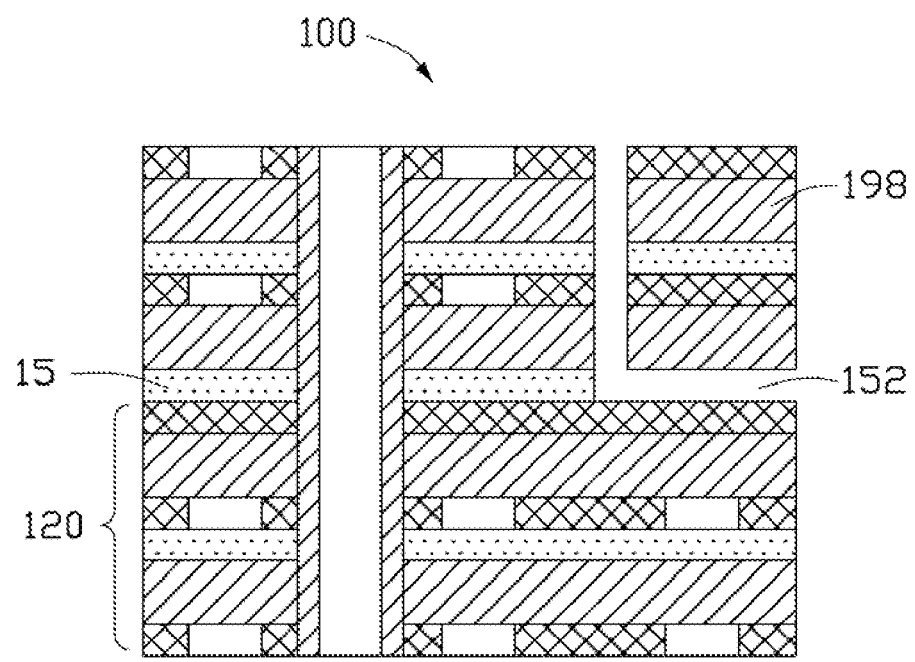

Referring to FIG. 2L, the portion 198 is removed and a multilayer flexible printed circuit hoard 100 having different number of layers in different areas is obtained. A portion of the second copper dad laminate structure 120 is exposed to an exterior through the opening 152 of the binder layer 15.

In the preferred embodiment, no stepped structure between the first copper clad laminate structure 110 and the second copper clad laminate structure 120 of the multilayer flexible printed circuit board 100 is formed, therefore the aforementioned problems in conventional methods can be avoided.

Figure 3A:
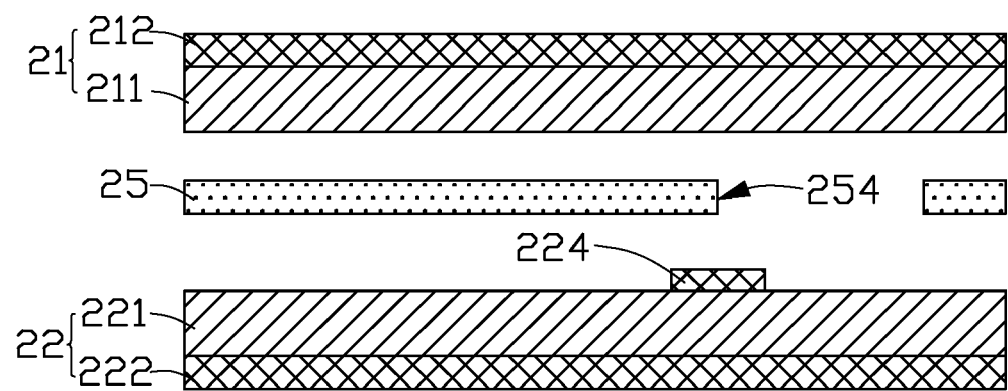
FIGS. 3A and 3B are schematic views showing a protective metallic block used in a method for manufacturing a multilayer FPCB having a different number of layers in different areas in accordance with a second preferred embodiment.
Figure 3B:
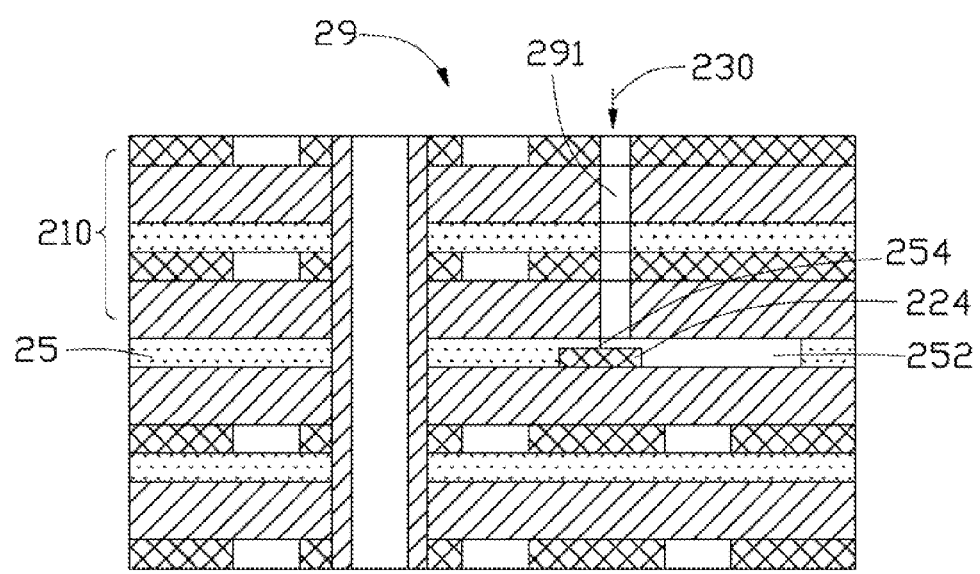
Figure 4A:
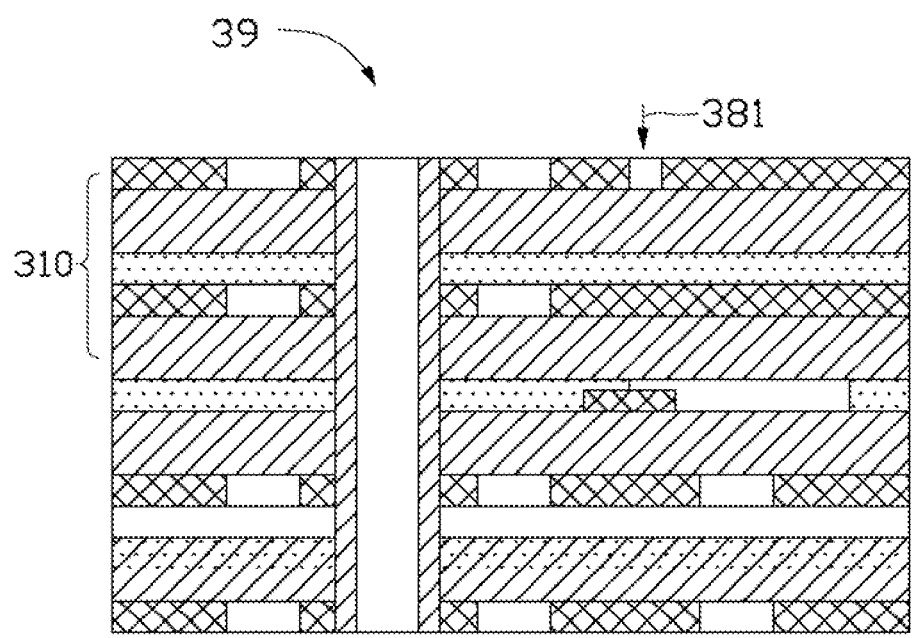
FIGS. 4A to 4D are schematic views showing cutting steps in a method for manufacturing a multilayer FPCB having a different number of layers in different areas in accordance with a third preferred embodiment.
Figure 4B:
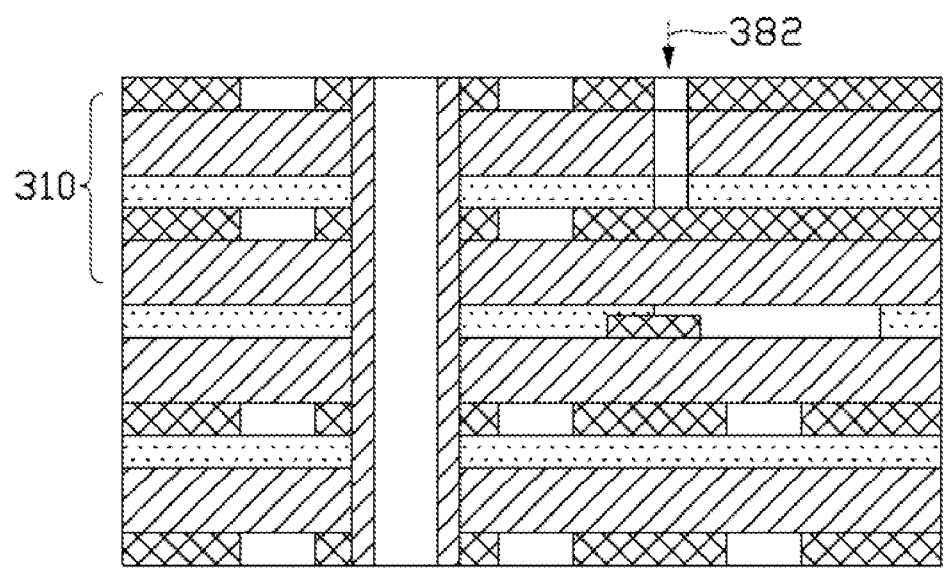
Figure 4C:
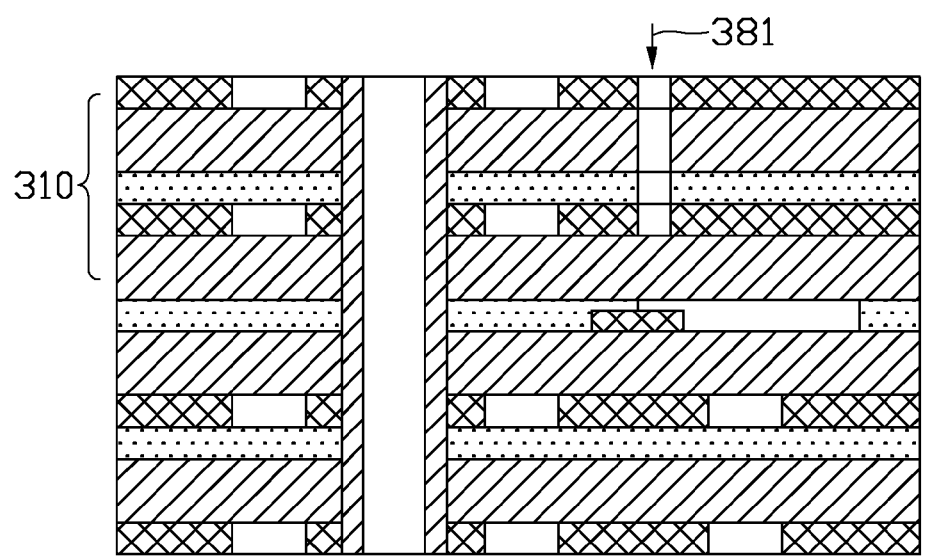
Figure 4D:
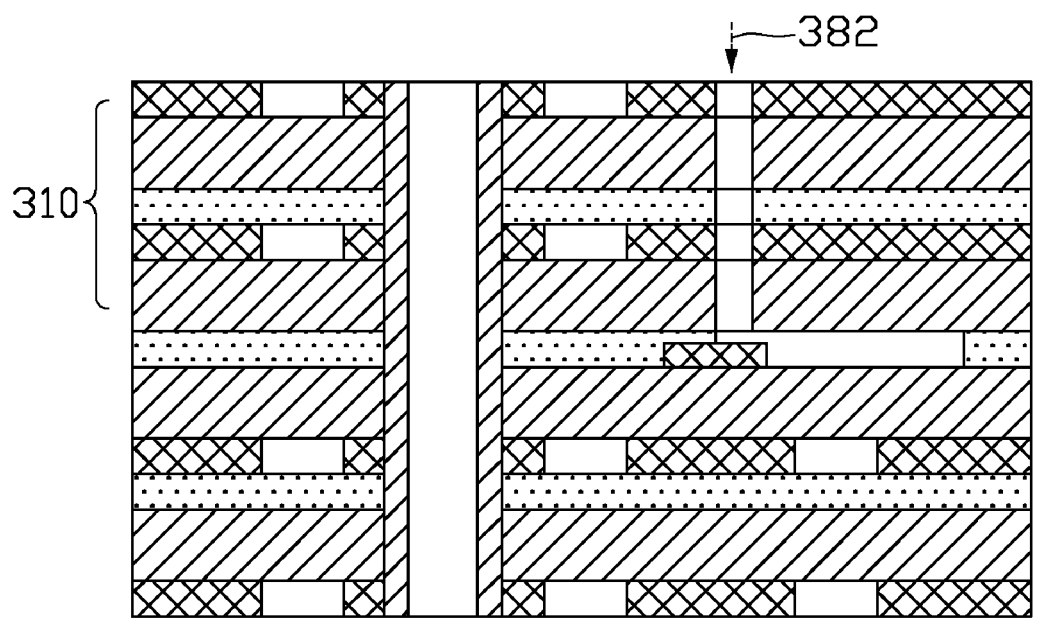
Figure 5A:
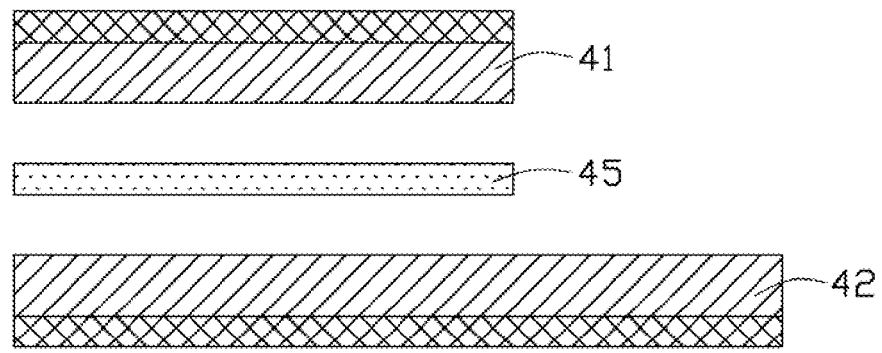
FIGS. 5A to 5F are schematic views show a process from the related art for manufacturing a multilayer FPCB having a different number of layers in different areas.
Figure 5B:
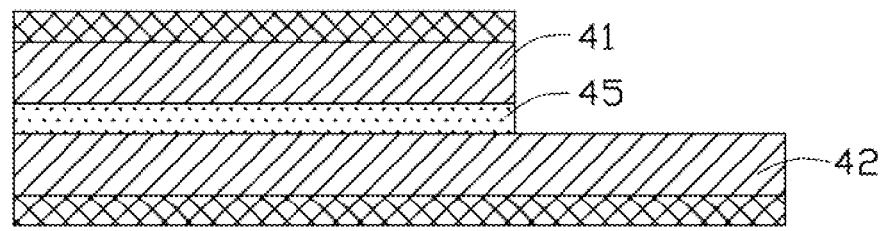
Figure 5C:
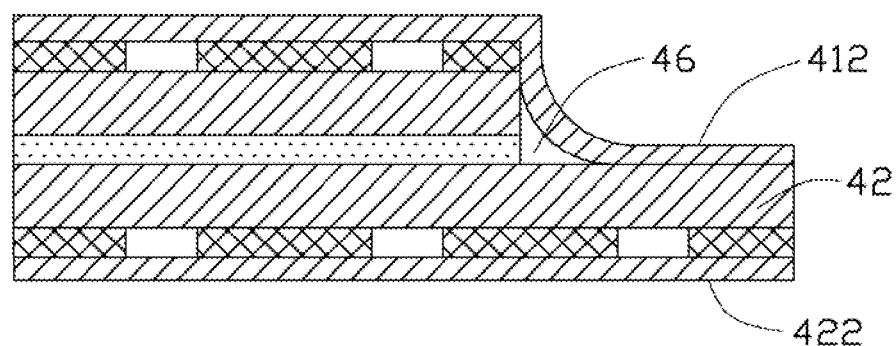
Figure 5D:
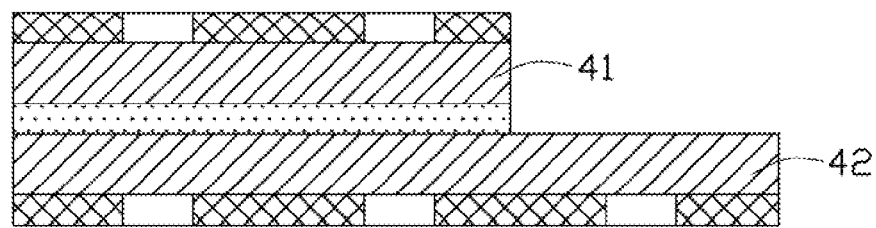
Figure 5E:
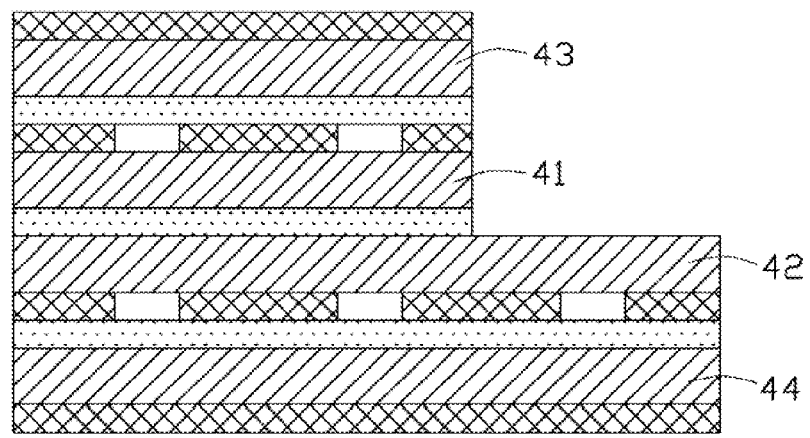
Figure 5F:
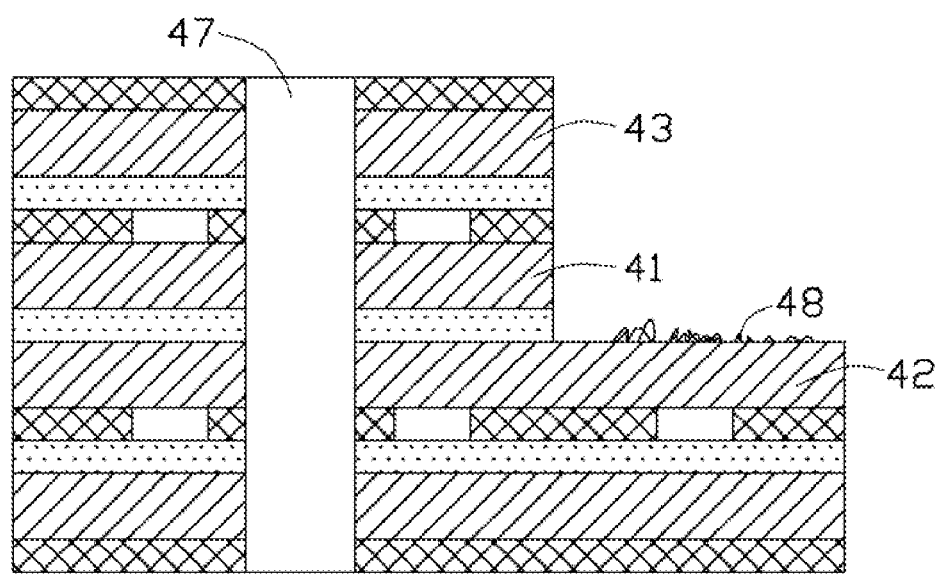

FIGS. 3A to 3B relate to a second preferred embodiment of a method for manufacturing a multilayer flexible printed circuit board having different number of layers in different areas. Referring to FIG. 3A, similar to the first embodiment, a first copper clad laminate 21, a binder layer 25, and a second copper clad laminate 22 are provided. The first copper clad laminate 21 has a dielectric layer 211 and a conductive layer 212 formed on the dielectric layer 211. The binder layer 25 has an opening 252 and a side-wall 254 exposed in the opening 252. The second copper clad laminate 22 includes a dielectric layer 221 and a conductive layer 222 formed on the dielectric layer 221. However, unlike the first embodiment, a protective coating 224 is formed on the dielectric layer 221 of the second copper clad laminate 22. Specifically, the dielectric layer 221 is sandwiched between the conductive layer 222 and the protective coating 224. The protective coating 224 can be a film of metal, such as copper, aluminum etc. The protective coating 224 can be made by sputtering, plating or laminating preformed protective coating 224 on the dielectric layer 221. The protective coating 224 corresponds to the side-wall 254 of the opening 252 of the binder layer 25.

Referring to FIG. 3B, when a multilayer FPCB substrate 29 is formed as steps similar to that described in the first embodiment, a first copper clad laminate structure 210 is cut by a laser beam 230, and then a slit 291 penetrating through the first copper clad laminate structure 210 is formed therein. The slit 291 is defined along the side-wall 254, and the protective coating 224 is below the slit 291. Portion of the protective coating 224 is received in the opening 252, and the other portion of the protective coating 224 is in contact with the binder layer 25. That is when the first copper clad laminate structure 210 is cut, the laser beam 230 corresponds to the protective coating 224. When the laser beam 230 reaches the protective coating 224, the protective coating 224 prevents the laser beam 230 from cutting further deeper, so in other words, the protective coating 224 acts as a protective metallic block.

A method for manufacturing a multilayer flexible printed circuit board in accordance with a third embodiment is similar to that of the second embodiment, except that there are no sub-slit formed in the conductive layers of the first copper clad laminate structure.

Referring to FIGS. 4A to 4D, after forming a multilayer FPCB substrate 39, a first laser beam 381 and a second laser beam 382 are alternatively used for cutting the conductive layers and the dielectric layers in the first copper clad laminate structure 310. The first laser beam 381 can be an Nd:YAG laser and is used to cut the conductive layers of the first copper clad laminate structure 310. The second laser beam 382 can be a carbon dioxide laser and is used to cut the dielectric layers and a binder layer of the first copper clad laminate structure 310.

In this preferred embodiment, no sub-slit needs to be formed on each conductive layer of the first copper clad laminate structure 310, so therefore the process is more simple.

Finally, it is to be understood that the above-described embodiments are intended to illustrate rather than limit the invention. Variations may be made to the embodiments without departing from the spirit of the invention a7s claimed. The above-described embodiments illustrate the scope of the invention but do not restrict the scope of the invention.

What is claimed is:

1. A method for manufacturing a multilayer flexible printed circuit board, the method comprising steps of:
   providing a binder layer;
   removing a portion of the binder layer thereby defining an opening in the binder layer;
   attaching a first copper clad laminate structure and a second copper clad laminate structure on opposite sides of the binder layer, thus forming, a multilayer FPCB substrate, each of the first copper clad laminate structure and the second copper clad laminate structure comprising at least one dielectric layer and at least one conductive layer formed thereon, the first copper clad laminate structure having an excess portion, the excess portion being located above the opening of the binder layer;
   defining a first slit in the first copper clad laminate structure along a boundary of the excess portion, the first slit being in communication with the opening of the binder layer; and
   removing the excess portion of the first copper clad laminate along the boundary of the excess portion of the first copper clad laminate, thus a portion of the second copper clad laminate being exposed to an exterior through the opening of the binder layer.

2. The method as claimed in claim 1, further comprising a step of defining a third slit in the at least one conductive layer in the first copper clad laminate structure prior to the step of defining a first slit in the first copper clad laminate structure, wherein the first slit in the first copper clad laminate structure is defined using a laser beam.

3. The method as claimed in claim 1, wherein a third slit is defined in the at least one conductive layer of the first copper clad laminate structure prior to the step of defining a first slit in the first copper clad laminate structure, and the third slit is defined by etching.

4. The method as claimed in claim 1, wherein the excess portion of the first copper clad laminate is removed by cutting the multilayer FPCB substrate along the boundary of the excess portion.

5. The method as claimed in claim 1, wherein the step of defining a first slit includes sub steps of defining a third slit in the at least one conductive layer of the first copper clad laminate structure using a first laser, and defining a fourth slit in the at least one dielectric layer of the first copper clad laminate structure using a second laser, the third slit and the fourth slit cooperatively constituting the first slit in the first copper clad laminate structure.

6. The method as claimed in claim 5, wherein the first laser is an Nd:YAG laser and the second laser is a carbon dioxide laser.

7. The method as claimed in claim 1, wherein a protective metallic block is formed between the first and the second copper clad laminate structures, a portion of the protective metallic block being received in the opening of the binder layer, the protective metallic block being located below the first slit.

8. The method as claimed in claim 7, wherein the protective metallic block is formed by sputtering or plating.

9. The method as claimed in claim 7, wherein the protective metallic block is comprised of copper or aluminum.

10. The method as claimed in claim 1, wherein the excess portion is removed by stamping.

11. The method as claimed in claim 1, wherein the at least one dielectric layer is comprised of a material selected from the group consisting of polyimide, teflon, polythiamine, polycarbonate, polycarbonate ester, polyester, and copolymer of imide, ethylene and dimethyl terephthalate.

12. The method as claimed in claim 1, wherein the at least one conductive layer is comprised of copper, silver or aluminum.

13. The method as claimed in claim 1, wherein the opening of the binder layer is formed by cutting, stamping, laser ablation or etching.

14. The method as claimed in claim 1, wherein in the multilayer FPCB substrate, one of the at least one conductive layer of the second copper clad laminate structure is in contact with the binder layer, and portion of said one of the at least one conductive layer is exposed to the opening of the binder layer.

15. A method for manufacturing a multilayer FPCB, the FPCB having a different number of layers in different areas, the method comprising steps of:
    providing a binder layer;
    forming an opening in the binder layer;
    attaching a first and a second copper clad laminate structures on opposite sides of the binder layer thereby forming a multilayer FPCB substrate, the first copper clad laminate structure comprising at least one dielectric layer and at least one conductive layer, the first copper clad laminate structure having an excess portion above the opening;
    using a first laser beam to cut the at least one conductive layer of the first laminate structure to form a first slit in the first copper clad laminate structure, the first slit being defined along a portion of the boundary of the excess portion;
    using a second laser beam to cut the at least one dielectric layer of the first copper clad laminate structure to form a second slit in the first copper clad laminate structure, the second slit being defined aligned with and in communication with the first slit, the opening being in communication with the second slit, thus the excess portion of the first copper clad laminate structure being exposed to the opening, the first slit, and the second slit;
    cutting the multilayer FPCB substrate along the other portion of the boundary of the excess portion thereby separating the excess portion from the first copper clad laminate structure.

16. The method as claimed in claim 15, wherein the first laser is an Nd:YAG laser, and the second laser is a carbon dioxide laser.

17. The method as claimed in claim 15, wherein a protective metallic block is formed between the first and the second copper clad laminate structures, and the protective metallic block corresponds to and is below the second slit.

18. A method for manufacturing a multilayer FPCB, the FPCB having a different number of layers in different areas, the method comprising steps of:
    providing a binder layer;
    forming an opening in the binder layer;
    attaching a first and a second copper clad laminate structures on opposite sides of the binder layer thereby forming a multilayer FPCB substrate, the first copper clad laminate structure comprising a base and a conductive layer at the outmost side of the multilayer FPCB substrate, the first copper clad laminate structure having an excess portion exposed to the opening;
    forming conductive patterns and a first slit in the conductive layer of the multilayer FPCB substrate, the first slit being defined along a portion of the boundary of the excess portion;
    cutting the base of the first laminate structure to form a second slit, which is aligned with the first slit, the second it being in communication with the first slit and the opening;
    cutting the multilayer FPCB substrate along the other portion of the boundary of the excess portion thereby separating the excess portion from the first copper clad laminate structure.

19. The method as claimed in claim 18, wherein the base is cut by a laser beam.

20. The method as claimed in claim 19, wherein the second copper clad laminate structure includes a conductive layer in contact with the binder layer.

* * * * *